United States Patent [19]

Yamada

[11] Patent Number: 4,480,237
[45] Date of Patent: Oct. 30, 1984

[54] SURFACE ACOUSTIC WAVE APPARATUS WITH A VARIABLE AMPLITUDE-FREQUENCY CHARACTERISTIC

[75] Inventor: Jun Yamada, Yokohama, Japan
[73] Assignee: Hitachi, Ltd., Tokyo, Japan
[21] Appl. No.: 424,371
[22] Filed: Sep. 27, 1982
[30] Foreign Application Priority Data
  Oct. 2, 1981 [JP] Japan ................ 56-156252
[51] Int. Cl.³ .................... H03H 9/64; H03H 9/42
[52] U.S. Cl. ........................ 333/193; 310/313 R; 333/150; 333/196
[58] Field of Search .................... 333/193–196, 333/150–155; 331/107 A; 310/313 R, 313 A, 313 B, 313 C, 313 D

[56] References Cited

U.S. PATENT DOCUMENTS

3,582,840 6/1971 De Vries ........................ 333/193

FOREIGN PATENT DOCUMENTS

139333 10/1979 Japan .

*Primary Examiner*—Marvin L. Nussbaum
*Attorney, Agent, or Firm*—Antonelli, Terry & Wands

[57] ABSTRACT

A surface acoustic wave apparatus comprises a surface acoustic wave element having one input electrode to which an input signal is supplied and two output electrodes, a variable gain element connected to the one output electrode, and an adder for adding the output of the variable gain element and the output of the other output electrode. The phase characteristic and the delay time characteristic of a filter determined by the input electrode and the one output electrode are the same as those of a filter determined by the input electrode and the other output electrode, respectively. Therefore, even if the amplitude-frequency characteristic of the adder varies, the phase characteristics and delay time are kept constant.

11 Claims, 6 Drawing Figures

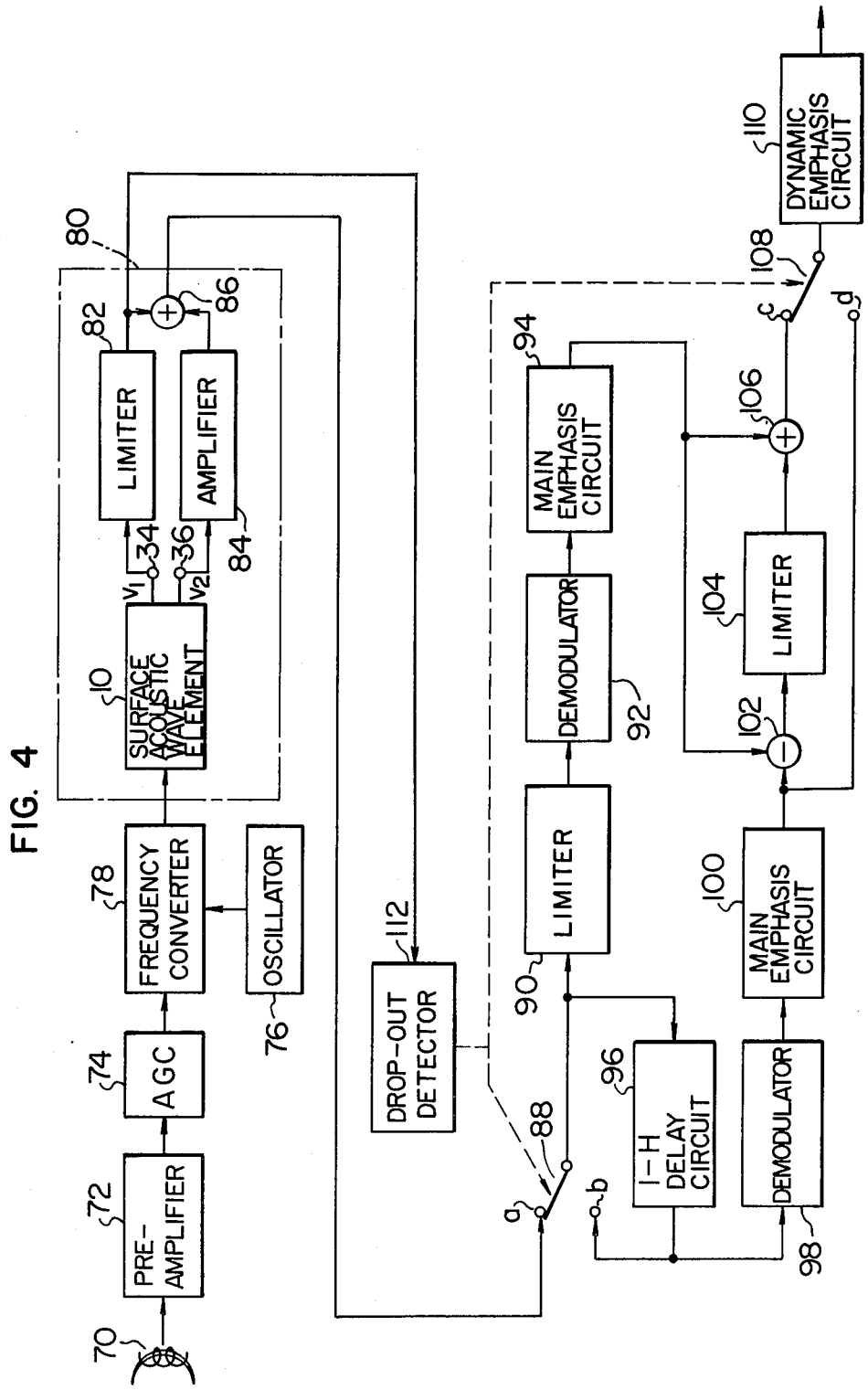

SURFACE ACOUSTIC WAVE APPARATUS WITH A VARIABLE AMPLITUDE-FREQUENCY CHARACTERISTIC

This invention relates to a surface acoustic wave apparatus with a variable amplitude-frequency characteristic.

A transmission circuit network, in which the phase, the delay time and the amplitude-frequency characteristics are important factors, is not solely limited to the technique of TV, the facsimile and the high speed data transmission in the field of communication industry, but has been treated as a basic electronic circuit for the color television receiver, the VTR which is replacing the color television, the VTR camera which is expected to have a large future development, and the video disc player (VDP).

In a representative transmission circuit network in which the phase and the delay time characteristics are considered, an inductance element or a capacitance element is often connected at the initial stage. In order to realize the required phase and delay time characteristics with such a circuit, the value of each element should be determined by a very complicated calculation. In the construction process of the circuit network, it is further necessary to adjust the value of the inductance element through a complicated procedure. Even in such a case, it is not possible to obtain any perfect adjustment. Moreover, it is impossible to freely change the amplitude-frequency characteristics of the circuit network. In an example of a transmission circuit network with a variable amplitude-frequency characteristic and controllable phase and delay time characteristics, a double differentiating circuit using a transistor is applied in the image character adjustment circuit of a color television receiver. Namely, the double differentiating circuit is provided between the collector and the emitter of a transistor, whereby an input signal given to the base is obtained as an output voltage on the emitter side. The signal going from the collector to the emitter is twice differentiated and superimposed on the output voltage at the emitter. Thus, by making the impedance on the emitter side variable, it becomes possible to vary the gain for a high frequency signal appearing on the collector side.

Such a transmission circuit network has a simple circuit constitution. Although both a variable amplitude-frequency characteristic and a nearly constant phase characteristic are realized, it is still difficult to have a satisfactorily large variable range of frequency. The drawback is that as the upper and lower limits of the frequency variable range are expanded the distortion of the phase characteristic increases.

In a recently developed transmission circuit network, only the amplitude-frequency characteristic is made to vary arbitrarily without variation of phase and delay time. The circuit network is disclosed in the Japanese Patent Kokai (Laid-Open) No. 139333/79, filed by Hitachi Ltd. filed on Apr. 20, 1978 and laid opened on Oct. 29, 1979.

In this circuit network, two filters are constituted with a surface acoustic wave element having a pair of input electrodes disposed on the center and two pairs of output electrodes disposed on both sides of the input electrodes, and with an adder circuit. An input signal is applied to the pair of input electrodes. The output at the one pair of output electrodes is applied to the one input of the adder circuit directly while the output at the other pair of output electrodes is applied to the other input of the adder circuit through a variable gain circuit. The amplitude-frequency characteristic of the input signal can be controlled by varying the gain of the variable gain circuit. However, in the constitution of this surface acoustic wave element, the delay time of a signal travelling from the pair of input electrodes to the pair of output electrodes is different from the delay time of signal travelling from the pair of input electrodes to the other pair of output electrodes. Therefore, the phase characteristics becomes different in the two filters. Therefore, as a whole, the phase characteristic varies greatly with a variation of the amplitude-frequency characteristic.

An object of this invention is to provide a surface acoustic wave apparatus in which the amplitude-frequency characteristic is made to vary arbitrarily with the phase and delay time characteristics kept constant.

In order to attain this object, the surface acoustic wave apparatus according to this invention has such a constitution that the delay time of an input signal travelling from one input electrode to the one output electrode and the phase thereof are made to equal to the delay time of a signal travelling from the input electrode to the other output electrode and the phase, respectively. In other words, the phase characteristics and delay time of a filter constituted with the input electrode and the one output electrode are made to be the same as those of another filter constituted with the input electrode and the other output electrode. The outputs of the former filter and the latter filter are applied to an adder circuit through a variable gain circuit and directly, respectively. Thereafter, the outputs of both filters are added.

In this way, since the phase characteristics and the delay time of the one filter are made to be equal to those of the other filter, the output obtained by adding their outputs has a constant phase characteristic which does not vary with a variation of the amplitude-frequency characteristic.

The present invention will be apparent from the following detailed description taken in conjunction with the accompanying drawings, in which:

FIG. 4 is a block diagram showing another embodiment of a surface acoustic wave apparatus of this invention applied to the reproduction system of a VTR.

Figure 1:
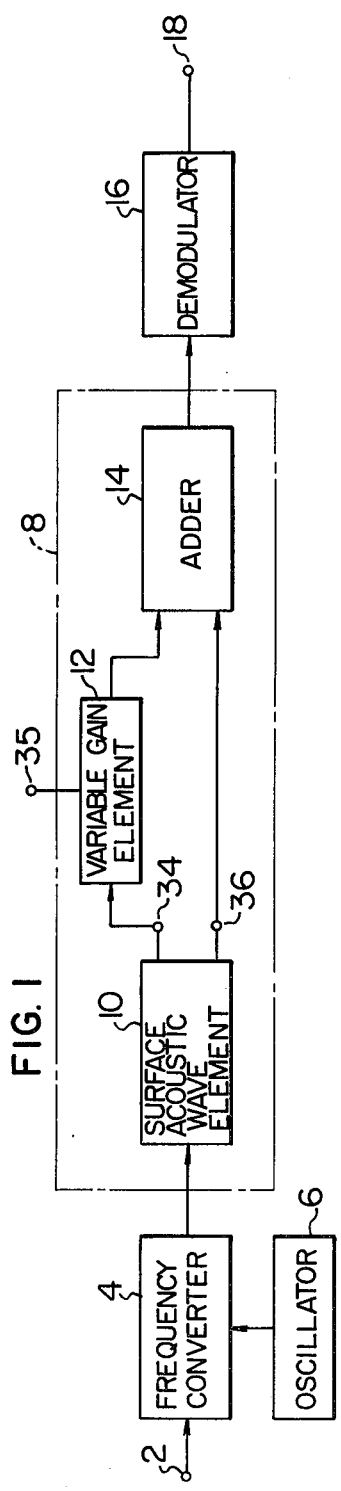
FIG. 1 is a block diagram showing an embodiment of a surface acoustic wave apparatus of this invention as applied to an image character adjustment circuit of a color television receiver.

Detailed explanation of the embodiments of this invention will be made hereinafter with reference to the drawings. FIG. 1 is a constitutional diagram showing one embodiment of a surface acoustic wave apparatus of this invention with a variable amplitude-frequency characteristics, as applied to a video character adjustment circuit of a color television receiver.

Figure 2:
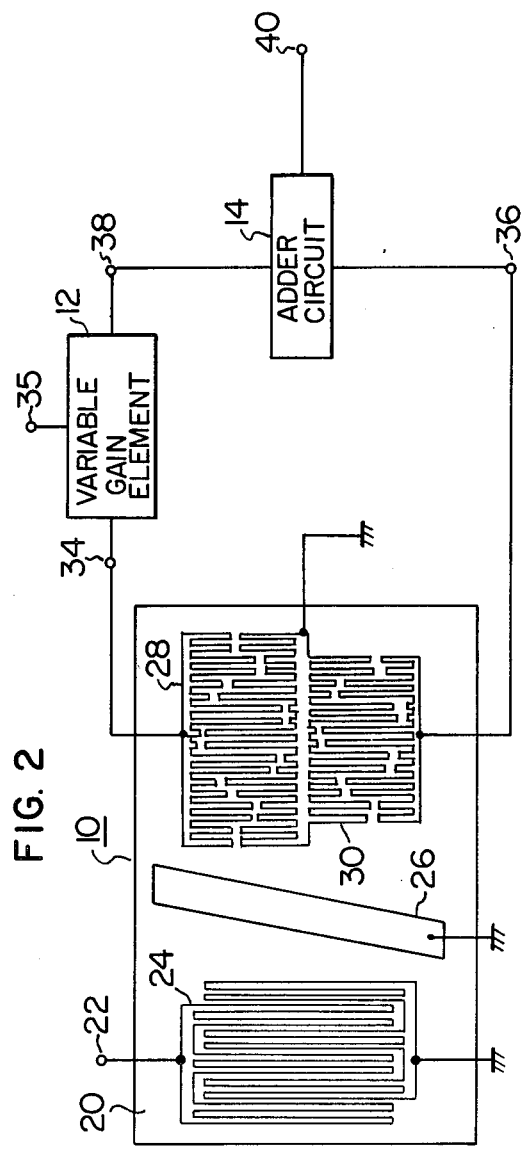
FIG. 2 is a constitution diagram of an embodiment of a surface acoustic wave apparatus according to this invention.

The brightness signal component of the television signal introduced to an input terminal 2 is converted to a high-frequency signal by an oscillator 6 and a frequency converter 4. The oscillator 6 frequency-multiplies the frequency of a local oscillator, which generates a chrominance subcarrier with a frequency $f_{sc}$ in the television receiver, to form a carrier for frequency conversion. Here, we assume that $f_{sc}=3.58$ MHz and the frequency multiplication is 3. Therefore, in the frequency converter 4, the signal is frequency-converted by an amount of 10.74 MHz (3.58 MHz ×3) with respect to a base band frequency. The signal which is converted to a higher frequency side is supplied to a surface acoustic wave element 10 in a surface acoustic wave apparatus 8. This element 10 has such a constitution as shown in FIG. 2. A high-frequency signal is converted to a surface acoustic wave by an input interdigital electrode 24.

The surface acoustic wave element 10 of this invention is constituted with two filters having the same phase characteristics and delay time. Here, we assume that the phase characteristics of the two filters are linear. The amplitude-frequency characteristic of the one filter is depressed in the component of high-frequency band in order to soften the video character while that of the other filter is enhanced in the component of high-frequency band in order to sharpen the video character.

A variable gain element 12 is connected to an output terminal 34 of the filter section with its high-frequency component enhanced. The output at an output terminal 36 of the filter section, with its high-frequency component depressed, is added to the output of the variable gain element in an adder 14. The output of the adder 14 is demodulated into a signal having a response with respect to the base band, and derived from an output terminal 18.

Thus, according to this invention, the variable gain element 12 and the adder 14 are connected to the surface acoustic wave element 10 so that a surface acoustic wave apparatus with a variable amplitude-frequency characteristic can be realized.

FIG. 2 is a brief planar constitution diagram of an embodiment of a surface acoustic wave apparatus with a variable amplitude-frequency characteristic according to this invention.

In the surface acoustic wave element 10 shown in FIG. 2, a piezoelectric substrate 20 is of lithium niobate (LiNbO$_3$) single crystal with 128° rotated Y-cut. The propagation direction of the excited surface acoustic wave is in X direction.

As the input interdigital electrode 24, 7 pairs of apodized electrodes with a central frequency of 12.54 MHz are used. The apertures and the pitchs of the input interdigital electrodes are constant and the width of the respective electrodes is 38.7 μm. Output interdigital electrodes 28 and 30 are made of 12 pairs of unapodized electrodes, in which the apertures and the pitchs of each of electrodes 28 and 30 are varied symmetrically with respect to the center of the respective electrodes to have a structure with a linear phase characteristic. In FIG. 2, the input and output interdigital electrodes show 2.5 and 4 pairs of electrodes for simplification. Both the input and output electrodes have a double electrode structure, in which an aluminum evaporation film of 6000 Å thickness is formed by the photolithographic technique. In FIG. 2, 22, 26, 34 and 36 denote an input terminal, a shield electrode, an output electrode and an output terminal, respectively.

The distance between the centers of the input electrode 24 and the output electrode 28 and the distance between the centers of the input electrode 24 and the output electrode 30 are equal to each other, i.e. 3800 μm. Thus, a high pass filter formed by the input electrode and the output electrode 28 and a low pass filter formed by the input electrode and the output electrode 30 have the same phase characteristics and delay time. The variable gain element 12 is connected electrically in series with the output terminal of the output electrode 28. The adder 14 is connected between the output terminal 38 and the output terminal 22 of the output electrode 30, and the output signal is derived from an output terminal 40. The variable gain element 12 is a variable gain amplifier whose gain is controlled by a control signal supplied to its input through a terminal 35. Although the variable gain amplifier is used as the variable gain element 12 here, either a limiter or a variable impedance element (variable attenuator) may be used.

Figure 3A:
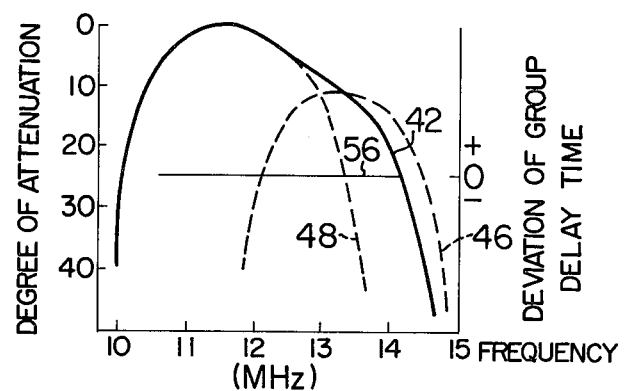
FIGS. 3a through 3c show diagrams of the amplitude-frequency characteristic and the group delay characteristic of a surface acoustic wave apparatus according to this invention.
Figure 3B:
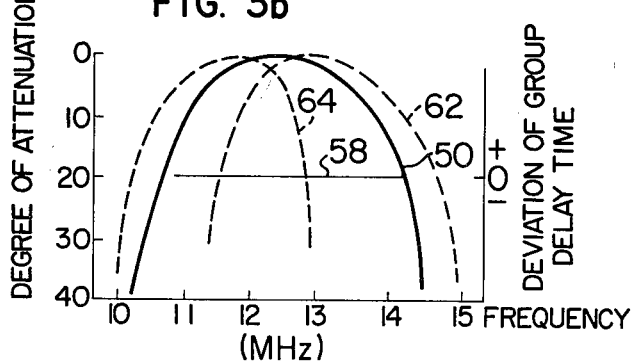
Figure 3C:
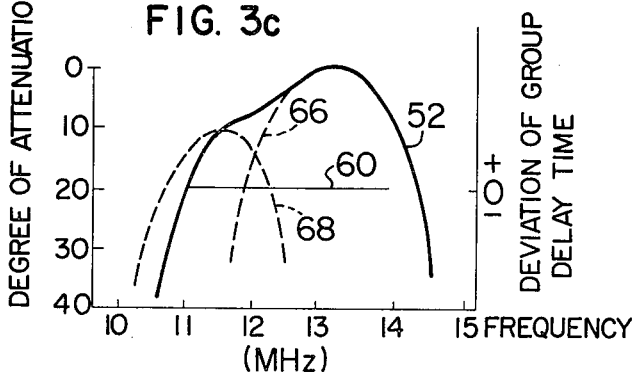

FIGS. 3a, 3b, and 3c show amplitude-frequency characteristics obtained with the surface acoustic wave apparatus shown in FIG. 2.

The interdigital output electrode 28 are made to have a high pass peaking characteristic as shown by a curve 46 in FIG. 3a in order to sharpen the image character. The interdigital output electrode 30 are made to have a low pass peaking characteristic as shown by a curve 48 in order to soften the image character. Therefore, the output of the adder 14 is given by a sum of the characteristic curves 46 and 48, as shown by a curve 42 in FIG. 3a. When the gain of the variable gain element 12 is small, the output of the adder has such an amplitude-frequency characteristic with the lower frequency range enhanced as shown by a characteristic curve 42. As the gain of the variable gain element 12 becomes larger, the peaking frequency moves toward a higher frequency range. In this way, the amplitude-frequency characteristic of the surface acoustic wave apparatus 10 can be adjusted arbitrarily between those of the two filters by controlling the gain of the variable gain element 12. In this case, since the phase characteristics of each of the output signals obtained at the terminals 34 and 36 are linear, the final phase characteristic of the output signal given by the adder becomes linear with respect to the frequency even if the gain of the variable gain element is varied.

Furthermore, since the delay times of the signals obtained at the output electrodes 28 and 30 are equal to each other, the group delay time characteristic remains flat, as shown by lines 56, 58 and 60 in FIGS. 3a, 3b, and 3c, even if the gain of the variable gain element is changed.

In the above embodiment, the phase characteristics of the output electrodes 28 and 30 are made to be linear, since the surface acoustic wave apparatus is applied to the video character adjustment circuit of a color TV receiver. However, in case of applying the present invention to other peaking circuits, it is required only to keep the whole phase characteristic constant independently of a variation of the amplitude-frequency characteristic, so that the patterns of the output electrodes are designed such that the phase characteristic of each output electrode are equal to each other.

FIG. 4 shows a constitution diagram of a surface acoustic wave apparatus with a variable amplitude-frequency characteristic according to this invention, which is applied to the reproduction system of a VTR. In this figure, 70 denotes a video head, 72 a preamplifier, 74 an AGC, 76 a local oscillator, 79 a frequency converter, 80 a surface acoustic wave apparatus of this invention, 88 a switch, 90 a limiter, 92 a demodulator, 94 a main emphasis circuit, 96 a 1-H delay circuit for delaying the input signal by one horizontal scan period, 98 a demodulator, 100 a main emphasis circuit, 102 a subtractor, 104 a limiter, 106 an adder, 108 a switch, 110 a dynamic emphasis circuit, and 112 a drop-out detecting circuit. This drop-out detecting circuit is provided to detect any drop-out of the output signal of the limitter 82 of the surface acoustic wave apparatus and compensates it by throwing the moving piece of the switches 88 and 108 to the terminals b and d respectively.

In the surface acoustic wave apparatus 80 of the present embodiment, the surface acoustic element 10 has the same constitution as shown in FIG. 2 except that the phase characteristics of the output electrodes 28 and 30 need not be linear. Only, they should be equal to each other. Further, the delay time of the output signals of the both electrodes are made to be the same.

The output terminal 34 of the output electrode 28 is connected to a limiter 82 used as a variable gain element, while the output terminal 36 of the output electrode 30 is connected to an amplifier with a constant amplification factor. These outputs are added by an adder 86. The limiter generates an output with a constant level without regard to a variation in the level of input signal. In the present embodiment, it is designed such that the outputs of the output electrodes 28 and 30 have high pass and low pass peaking characteristics, as shown by the curves 62 and 64 in FIG. 3b.

Now, explanation will be made of the operation of the surface acoustic wave apparatus 80 with reference to FIGS. 3a, 3b. and 3c. Let us assume that the output levels of the limiter 82 and the amplifier 84 are $v_1$ and $v_2$ respectively. The both outputs $v_1$ and $v_2$ are added by the adder 12. The resultant addition output is given by the average of $v_1$ and $v_2$, or the amplitude-frequency characteristic shown by a curve 50, when the output level of a head 70 is in the normal state. However, if the output level of the head 70 drops, the output levels of the output electrodes 28 and 30 decrease. Since the output of the output electrode 28 passes through the limiter 82, the level of $v_1$ does not change. On the other hand, since the output of the output electrode 30 passes through an amplifier with a constant gain, the level of $v_2$ decreases when the output level of the head drops. The resultant output of the adder is given by an amplitude-frequency characteristic as shown by a curve 52 of FIG. 2c. In this manner, any drop of the output level of the head can be automatically compensated by the surface acoustic wave apparatus. Therefore, in the surface acoustic wave apparatus of the present embodiments, even if the amplitude-frequency characteristic changes with a variation in the output level of the head for compensating the variation thereof, the total phase and the group delay time characteristics of the signal derived from the output of the adder 86 are kept constant.

Furthermore, in the present embodiment, the output of the output electrode 30 may be given directly to the adder 86 without interposition of the amplifier 84.

As described above, with the surface acoustic wave apparatus of this invention one can vary the amplitude-frequency characteristic arbitrarily under the condition that both the phase characteristics and delay time are kept constant. Therefore, the apparatus may be applied to the frequency peaking circuit in a color television and a VTR, etc.

What is claimed is:

1. A surface acoustic wave apparatus with a variable amplitude-frequency characteristic comprising an input terminal for receiving an electric input signal;

a surface acoustic wave element having an input electrode for converting said electric input signal to a surface acoustic wave and propagating the latter to the surface portion of a piezoelectric substrate and output electrodes for converting said propagated surface acoustic wave again to an electric signal, said input electrode being formed by a first interdigital electrode while said output electrode being formed by internally connected second and third interdigital electrodes and provided at a position where the surface acoustic waves radiated from said first interdigital electrode and reaching said second and third interdigital electrodes respectively do not mutually couple and the delay time characteristic appearing between said first and second interdigital electrodes and the phase characteristic of a filter determined by said first and second interdigital electrodes are the same as the delay time characteristic appearing between said first and third interdigital electrodes and the phase characteristic of a filter determined by said first and third interdigital electrodes, respectively;

a variable gain function element connected to said second interdigital electrode;

a connection means connected to said third interdigital electrode; and an adder circuit for adding the output signal of said third interdigital electrode derived from said connection means and the output signal of said variable gain function element.

2. A surface acoustic wave apparatus according to claim 1, wherein the phase characteristic of a filter determined by said first and second interdigital electrodes and that of a filter determined by said first and third interdigital electrodes are linear.

3. A surface acoustic wave apparatus according to claim 1, wherein said connection means is an amplifier with a constant gain.

4. A surface acoustic wave apparatus according to claim 1, wherein the gain of said variable gain element is varied by an external control signal, and with a variation of the gain of said variable gain element the amplitude-frequency characteristic of the output of said adder can be controlled arbitrarily under the condition that the phase characteristics and the delay time are kept constant.

5. A surface acoustic wave apparatus according to claim 3, wherein said variable gain element is a limiter and that the frequency characteristic of the output of said adder exhibits a high peaking characteristic.

6. A surface acoustic wave apparatus according to claim 1, wherein said second and third interdigital electrodes have different constructions from one another so that the filter determined by said first and second interdigital electrodes has a different frequency characteristic than the filter determined by said first and third interdigital electrodes.

7. A surface acoustic wave apparatus according to claim 6, wherein said second and third interdigital electrodes are constructed so that said filter determined by said first and second interdigital electrodes is a high pass filter and said filter formed by said first and third electrodes is a low pass filter.

8. A surface acoustic wave apparatus according to claim 1, wherein a distance between the centers of said first and second interdigital electrodes is equal to a distance between the centers of said first and third interdigital electrodes.

9. A surface acoustic wave apparatus according to claim 1, wherein said first interdigital electrode has first and second sides which face opposite to one another and wherein said second and third interdigital electrodes are both located to face only one of said first and second sides.

10. A surface acoustic wave apparatus according to claim 6, wherein a distance between the centers of said first and second interdigital electrodes is equal to a distance between the centers of said first and third interdigital electrodes.

11. A surface acoustic wave apparatus according to claim 7, wherein a distance between the centers of said first and second interdigital electrodes is equal to a distance between the centers of said first and third interdigital electrodes.

* * * * *